US009973302B2

(12) United States Patent
Shen et al.

(10) Patent No.: US 9,973,302 B2
(45) Date of Patent: May 15, 2018

(54) POLAR CODE HYBRID AUTOMATIC REPEAT REQUEST METHOD AND APPARATUS, AND WIRELESS COMMUNICATIONS APPARATUS

(71) Applicant: Huawei Technologies Co., Ltd., Shenzhen (CN)

(72) Inventors: Hui Shen, Shenzhen (CN); Bin Li, Shenzhen (CN); Yuchen Shi, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 44 days.

(21) Appl. No.: 15/280,546

(22) Filed: Sep. 29, 2016

(65) Prior Publication Data

US 2017/0019214 A1 Jan. 19, 2017

Related U.S. Application Data

(63) Continuation of application No. PCT/CN2014/074398, filed on Mar. 31, 2014.

(51) Int. Cl.
*H03M 13/00* (2006.01)
*H04L 1/00* (2006.01)
*H04L 1/18* (2006.01)
*H03M 13/13* (2006.01)

(52) U.S. Cl.
CPC .......... *H04L 1/0067* (2013.01); *H03M 13/13* (2013.01); *H03M 13/6306* (2013.01); *H04L 1/0061* (2013.01); *H04L 1/1819* (2013.01)

(58) Field of Classification Search
CPC ... H04L 1/0067; H04L 1/0061; H04L 1/1819; H03M 13/13; H03M 13/6306
See application file for complete search history.

(56) References Cited

U.S. PATENT DOCUMENTS

| 2014/0108748 A1* | 4/2014 | Lee | H03M 13/1111 |
| | | | 711/154 |
| 2016/0204811 A1* | 7/2016 | Goela | H04B 1/123 |
| | | | 375/260 |
| 2016/0285479 A1* | 9/2016 | El-Khamy | H03M 13/6368 |

FOREIGN PATENT DOCUMENTS

| CN | 102187610 A | 9/2011 |
| CN | 102739378 A | 10/2012 |

(Continued)

OTHER PUBLICATIONS

Erdal Arikan, "Channel polarization: A method for constructing capacity-achieving codes for symmetric binary-input memoryless channels", Jul. 24, 2008, 23 pages.

(Continued)

*Primary Examiner* — Christine Tu

(57) ABSTRACT

A method includes: selecting, from M polar codes of a same code length and code rate, a polar code corresponding to an actual code rate for a first transmission, and encoding an information bit sequence by using the polar code to obtain encoded bits; and performing rate matching on the encoded bits to generate to-be-sent bits. Different from a traditional HARQ using one polar code, in this embodiment, a polar code corresponding to the actual code rate for the first transmission is selected from the M polar codes during the initial transmission, so that a different polar code can be selected adaptively according to the actual code rate for the first transmission.

13 Claims, 5 Drawing Sheets

(56) References Cited

FOREIGN PATENT DOCUMENTS

CN 103281166 A 9/2013
WO 2014021837 A1 2/2014

OTHER PUBLICATIONS

Kai Chen et al., "A Hybrid ARQ Scheme Based on Polar Codes", IEEE Communications Letters, vol. 17, No. 10, Oct. 2013, p. 1996-1999.
Viveck R. Cadambe et al., "Interference Alignment and Spatial Degrees of Freedom for the K User Interference Channel", IEEE, 2008, p. 971-975.

\* cited by examiner

POLAR CODE HYBRID AUTOMATIC REPEAT REQUEST METHOD AND APPARATUS, AND WIRELESS COMMUNICATIONS APPARATUS

CROSS-REFERENCE TO RELATED APPLICATIONS

This application is a continuation of International Application No. PCT/CN2014/074398, filed on Mar. 31, 2014, the disclosure of which is hereby incorporated by reference in its entirety.

TECHNICAL FIELD

The present invention relates to the field of communications technologies, and more specifically, to a polar code hybrid automatic repeat request method and apparatus, and a wireless communications apparatus.

BACKGROUND

A hybrid automatic repeat request (HARQ) manner may be used in a communications system for error control. In an HARQ technology, a polar code (polar codes) may be used as a mother code.

In an HARQ process, affected by a channel status and a status of an allocated radio resource, an actual code rate for a first transmission (an initial transmission) may be different, but used polar codes are the same. Therefore, when a difference between the actual code rate for the first transmission and a target code rate corresponding to the polar code is excessively large, there is a performance loss in the first transmission.

SUMMARY

In view of this, an objective of embodiments of the present invention is to provide a polar code hybrid automatic repeat request method and apparatus, and a wireless communications apparatus, to resolve a problem of a performance loss in a first transmission when a difference between an actual code rate for the first transmission and a target code rate corresponding to a polar code is excessively large.

To achieve the foregoing objective, the embodiments of the present invention provide the following technical solutions:

According to a first aspect of the embodiments of the present invention, a polar code hybrid automatic repeat request HARQ method is provided based on M polar codes of a same code length and code rate, where M is greater than or equal to 2; and the method includes:

selecting, from the M polar codes, a polar code corresponding to an actual code rate for a first transmission, and encoding an information bit sequence by using the polar code to obtain encoded bits; and performing rate matching on the encoded bits to generate to-be-sent bits.

According to a second aspect of the embodiments of the present invention, a polar code hybrid automatic repeat request HARQ apparatus is provided, including:

a selection and encoding unit, configured to: select, from M polar codes of a same code length and code rate, a polar code corresponding to an actual code rate for a first transmission, and encode an information bit sequence by using the polar code to obtain encoded bits, where M is greater than or equal to 2; and a rate matching unit, configured to perform rate matching on the encoded bits to generate to-be-sent bits.

According to a third aspect of the embodiments of the present invention, a wireless communications apparatus is provided, including a processor and a memory, where the processor performs at least the following steps by running a software program stored in the memory and invoking data stored in the memory:

selecting, from M polar codes of a same code length and code rate, a polar code corresponding to an actual code rate for a first transmission, and encoding an information bit sequence by using the polar code to obtain encoded bits, where M is greater than or equal to 2; and performing rate matching on the encoded bits to generate to-be-sent bits.

It can be learned that, different from a traditional HARQ using one polar code, in this embodiment, M (more than one) polar codes are preset. During an initial transmission, a polar code corresponding to an actual code rate for a first transmission is selected from the M polar codes, which can implement that a different polar code is selected adaptively according to the actual code rate for the first transmission. Moreover, the selected polar code corresponds to the actual code rate for the first transmission, thereby avoiding an excessively large difference between the actual code rate for the first transmission and a target code rate of a polar code, and further avoiding a problem of a performance loss in the first transmission due to the excessively large difference between the actual code rate for the first transmission and the target code rate corresponding to the polar code.

BRIEF DESCRIPTION OF DRAWINGS

To describe the technical solutions in the embodiments of the present invention or in the prior art more clearly, the following briefly describes the accompanying drawings required for describing the embodiments or the prior art. Apparently, the accompanying drawings in the following description show merely some embodiments of the present invention, and a person of ordinary skill in the art may still derive other drawings from these accompanying drawings without creative efforts.

DETAILED DESCRIPTION

The following clearly and completely describes the technical solutions in the embodiments of the present invention with reference to the accompanying drawings in the embodiments of the present invention. Apparently, the described embodiments are merely some but not all of the embodiments of the present invention. All other embodiments obtained by a person of ordinary skill in the art based on the embodiments of the present invention without creative efforts shall fall within the protection scope of the present invention.

A hybrid automatic repeat request method may be applied to a wireless communications device including (but not limited to) a base station, a terminal, a WiFi AP (Access Point), a WiFi terminal, a relay station, or the like.

In an HARQ technology, a polar code (polar codes) may be used as a mother code to encode an information bit sequence.

Figure 1:
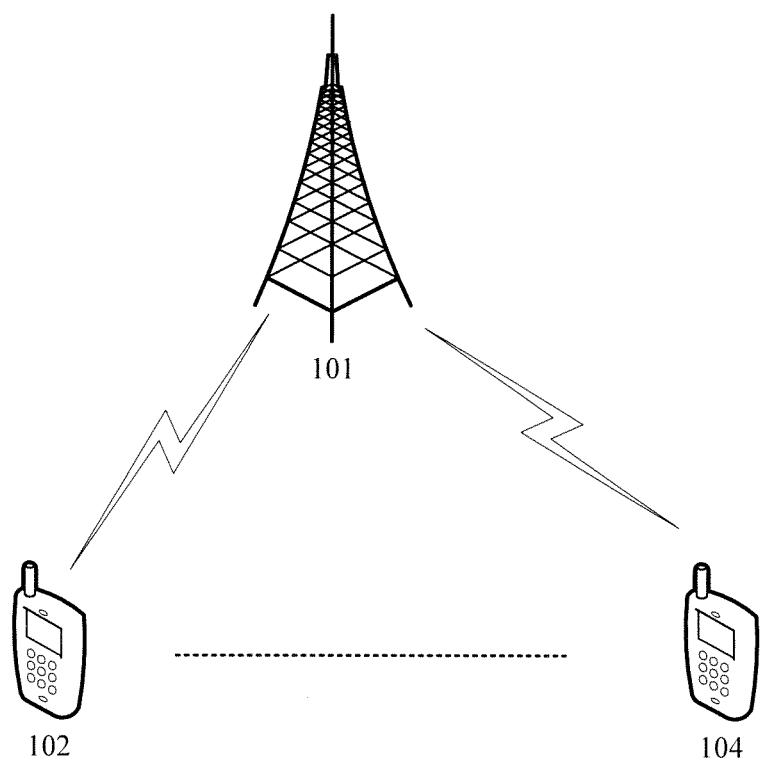
FIG. 1 is a schematic diagram of an application scenario of a hybrid automatic repeat request method according to an embodiment of the present invention.

FIG. 1 shows an application scenario of the foregoing hybrid automatic repeat request method, which is applied to communication between a base station 101 and any quantity of terminals such as an access terminal 102 and an access terminal 104.

The access terminals 102 and 104 may be, for example, a cellular phone, a smart phone, a portable computer, a handheld communications device, a handheld computing device, a satellite radio apparatus, a global positioning system, a PDA, and/or any other suitable devices.

Figure 2:
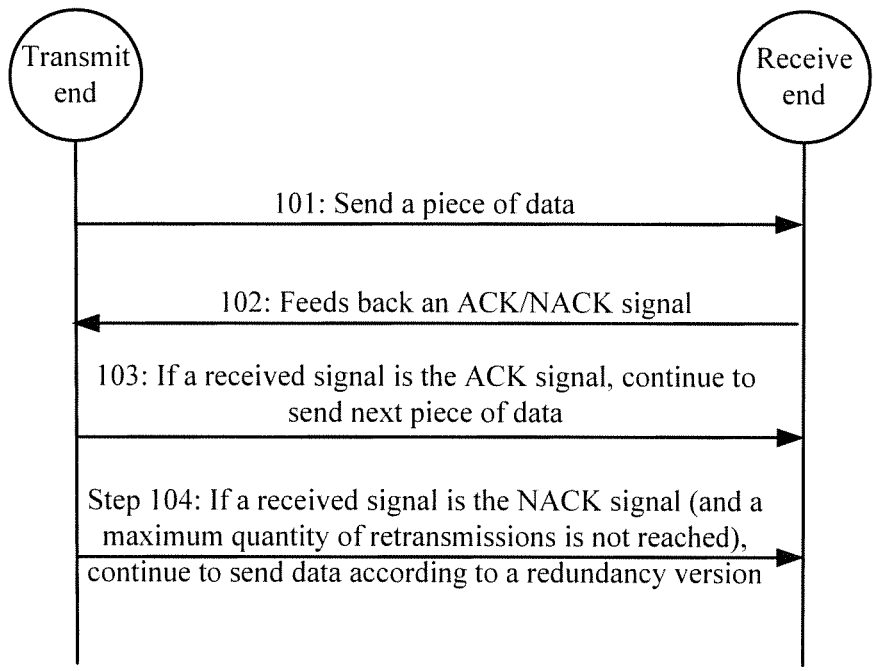
FIG. 2 is a schematic flowchart involved in a hybrid automatic repeat request scenario according to an embodiment of the present invention.

In an example in which the base station acts as a transmit end, and the terminal acts as a receive end, a schematic process involved in a hybrid automatic repeat request scenario may be shown in FIG. 2.

Step 101: The transmit end (the base station) sends a piece of data.

Step 102: The receive end (the terminal) decodes the received data, and if decoding is performed correctly, feeds back an ACK signal to the transmit end, or if decoding fails, feeds back a NACK signal to the transmit end.

Step 103: If a received signal is the ACK signal, the transmit end continues to send next piece of data.

Step 104: If a received signal is the NACK signal (and a maximum quantity of retransmissions is not reached), the transmit end continues to send data according to a redundancy version.

As described previously, in the HARQ technology, a polar code (polar codes) may be used as a mother code to encode an information bit sequence.

However, according to a channel status and a radio resource allocation status, an actual code rate for a first transmission (an initial transmission) may be different. Therefore, quantities of bits punctured during the first transmission are different, and for polar codes, corresponding channels during the actual initial transmission are also different.

For example, it is assumed that the polar code acting as the mother code is designed for an unpunctured polar code whose target code rate is 0.5. In practice, however, an actual code rate for a first transmission (an initial transmission) may be 0.5, 0.6, 0.8, or the like. Therefore, rating matching is required for implementing HARQ.

In this way, when a difference between the actual code rate for the first transmission and a target code rate corresponding to a polar code is excessively large, there is a performance loss in the first transmission at times.

To resolve the foregoing problem, an embodiment of the present invention provides a hybrid automatic repeat request method based on M polar codes ($M \geq 2$).

A code rate and a code length of the M polar codes are given. For example, the code rate of the M polar codes may be 0.5, and the code length thereof may be 2048.

Figure 3:
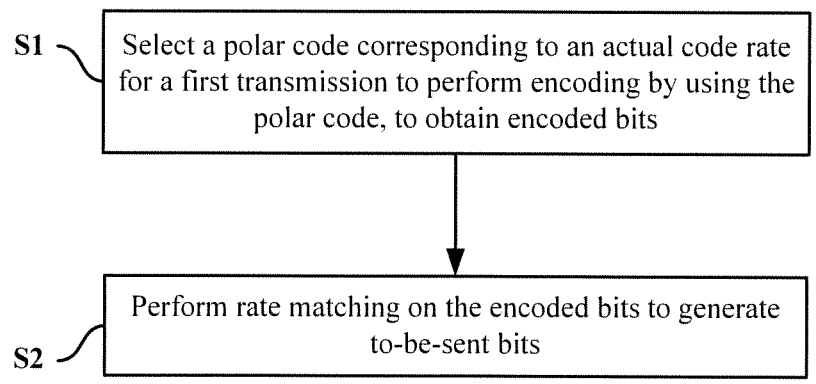
FIG. 3 is a schematic flowchart of a hybrid automatic repeat request method according to an embodiment of the present invention.

FIG. 3 is a schematic flowchart of a hybrid automatic repeat request method according to an embodiment of the present invention, where the method is based on the M polar codes, and the method may include the following steps:

S1: Select, from the M polar codes, a polar code corresponding to an actual code rate for a first transmission, and encode an information bit sequence by using the polar code to obtain encoded bits.

After the polar code is selected, for encoding the information bit sequence by using the polar code, an existing encoding manner may be used, which is not further described herein.

S2: Perform rate matching on the encoded bits to generate to-be-sent bits.

For performing rate matching on the encoded bits to generate the to-be-sent bits, an existing rate matching manner may be used, which is not further described herein.

After the to-be-sent bits are generated, regular processing, for example, modulation, may further be performed subsequently for final sending, which is not further described herein.

It can be learned that, different from a traditional HARQ using one polar code, in this embodiment, M (more than one) polar codes are preset. During an initial transmission, a polar code corresponding to an actual code rate for a first transmission is selected from the M polar codes, which can implement that a different polar code is selected adaptively according to the actual code rate for the first transmission. Moreover, the selected polar code corresponds to the actual code rate for the first transmission, thereby avoiding an excessively large difference between the actual code rate for the first transmission and a target code rate of a polar code, and further avoiding a problem of a performance loss in the first transmission due to the excessively large difference between the actual code rate for the first transmission and the target code rate corresponding to the polar code.

Figure 4:
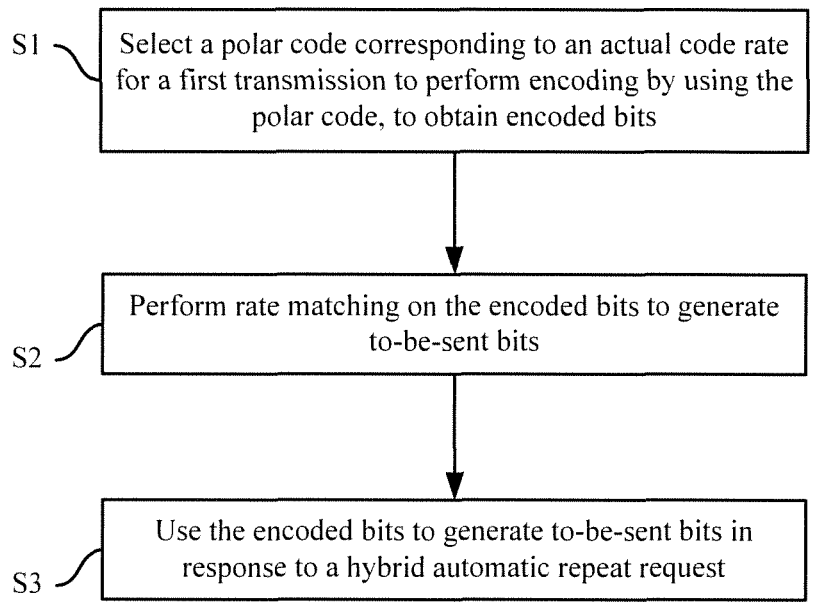
FIG. 4 is another schematic flowchart of a hybrid automatic repeat request method according to an embodiment of the present invention.

In another embodiment of the present invention, referring to FIG. 4, the foregoing embodiment may further include the following steps:

S3: When a hybrid automatic repeat request (that is, a NACK signal) is received, and a maximum quantity of retransmissions is not reached, generate, according to a redundancy version, to-be-sent bits in response to the hybrid automatic repeat request by using the encoded bits and send the to-be-sent bits.

For generating the to-be-sent bits in response to the hybrid automatic repeat request by using the encoded bits, an existing generation manner may be used, for example, rate matching may be performed on the encoded bits, which is not further described herein.

However, when the maximum quantity of retransmissions is reached or an ACK signal is received, next piece of data may continue to be sent.

When the next piece of data is sent, for steps performed, refer to step S1 and step S2 or step S1 to step S3.

More specifically, when the next piece of data is sent, the polar code used in step S1 may be directly used. Certainly, a new polar code may be selected. A person skilled in the art may make a specific design as desired. Details are not further described herein.

In another embodiment of the present invention, the M polar codes in all of the foregoing embodiments are designed for different target code rates.

Correspondingly, "select a corresponding polar code" in step S1 may specifically include:

selecting a polar code whose target code rate is closest to the actual code rate for the first transmission.

For example, it is assumed that M is equal to 3, and the polar codes include a polar code 1, polar code 2, and polar code 3. A code rate of the polar code 1 to the polar code 3 is 0.5. However, the polar code 1 is designed (constructed) for a target code rate of 0.5, the polar code 2 is designed for a target code rate of 0.6, and the polar code 2 is designed for a target code rate of 0.8.

When the actual code rate for the first transmission is 0.75, in the three polar codes, the target code rate corresponding to the polar code 3 is closest to 0.75, so that the polar code 3 may be selected to encode the information bit sequence.

However, if the actual code rate for the first transmission is 0.45, in the three polar codes, the target code rate corresponding to the polar code 1 is closest to 0.45, so that the polar code 1 may be selected to encode the information bit sequence.

Further, the target code rate may specifically refer to a target code rate for an initial transmission (the first transmission).

The following describes the M different polar codes in detail.

Main parameters of a polar code may include (N,K,A, $U_{Ac}$), where N represents a code length; K represents an information bit length (also referred to as quantity); A represents an information bit index set; and $U_{Ac}$ is a frozen bit, where a quantity of frozen bits is (N−K), and the frozen bit is a known bit. For simplicity, the frozen bit may be set to 0. Therefore, it may also be considered that the main parameters of the polar code include (N,K,A).

As described previously, the M polar codes have a same code length and code rate; therefore, the M polar codes have a same information bit length (that is, parameters K are the same).

However, the M polar codes have different but similar information bit index sets, that is, the M polar codes have different but similar A.

Similarity between the polar codes may be represented by the following formulas:

$$\begin{cases} A_i \\ A_1 = (A_i - \xi A_1) \cup \delta A_1 \\ A_2 = (A_i \xi A_2) \cup \delta A_2 \\ \ldots \\ A_{M-1} = (A_i - \xi A_{M-1}) \cup \delta A_{M-2} \end{cases}$$

In the foregoing formulas, $A_i$ represents an information bit index set of the $i^{th}$ polar code, and $A_1$:$A_{M-1}$ represents respective information bit index sets of the other (M−1) polar codes.

$\xi A_1$ represents a set of elements removed (elements removed from $A_i$) for constructing $A_1$, $\delta A_1$ represents a set of elements added for constructing $A_1$, and so on. Details are not further described herein.

Alternatively, $A_1=(A_i-\xi A_1)\cup\delta A_1$, $A_2=(A_i-\xi A_2)\cup\delta A_2$, ..., and $A_{M-1}=(A_i-\xi A_{M-1})\cup\delta A_{M-2}$ may be represented as $A_m=(A_i-\xi A_m)\cup\xi A_m$, where $A_m$ represents an information bit index set of the $m^{th}$ polar code in the other (M−1) polar codes (1≤i≤M, 1≤m≤M−1, m≠i), $\xi A_m$ represents a set of elements removed from $A_i$ for generating $A_m$, and $\xi A_m$ represents a set of elements added to $A_i$ for generating $A_m$.

For example, assuming that $A_i$ is {1,2,3,4,5,6}, and $A_i$ is {1,2,3,4,5,8}, $\xi A_1$ is {6}, and $\xi A_1$ is {8}.

For another example, assuming that N=2048, and the code rate is 0.5, a typical target code rate may be 0.5, 0.8, or the like.

For the target code rate of 0.5, a traditional polar code construction algorithm may be used to generate an information bit index set $A_i$ of the polar code 1.

Likewise, the other (M−1) polar codes may be constructed for several typical target code rates for the initial transmission.

It is assumed that the $m^{th}$ polar code (polar code m) is designed for the target code rate of 0.8, and an information bit index set corresponding to the $m^{th}$ polar code is $A_m$.

Table 1 gives the set $\xi A_m$ of elements removed for constructing $A_m$, and Table 2 gives the set $\xi A_m$ of elements added for constructing $A_m$. It can be seen that, there are only 26 elements (also referred to as bit indexes) different between the sets $A_m$ and $A_i$, and $A_m$ and $A_i$ include 1024 bit indexes each.

TABLE 1

$\xi A_m$={ 255 381 439 443 445 486 489 623 631
687 694 697 698 717 718 811 813 814
839 1087 1134 1139 1141 1181 1182
1191}

TABLE 2

$\delta A_m$={ 752 852 866 906 913 960 1208 1322 1349
1416 1424 1440 1472 1558 1571 1584
1604 1608 1616 1632 1665 1666, 1668
1672 1793 1794}

The $m^{th}$ polar code in the M polar codes may be generated in the following manner:

calculating an error probability of each bit channel for transmitting the $m^{th}$ polar code; and sorting the error probabilities of all the bit channels, and selecting bit indexes corresponding to K bit channels with smallest error probabilities as an information bit set of the $m^{th}$ polar code.

SC (successive-cancellation, successive-cancellation) decoding may be used for decoding the polar codes, and a process thereof is as follows:

A polar code is taken into consideration, and its parameters are (N,K,A,$u_Ac$).

In the SC decoding, the following conditional likelihood function is calculated sequentially:

$$L_N^{(i)}(y_1^N, \hat{u}_1^{i-1}) \triangleq \frac{W_N^{(i)}(y_1^N, \hat{u}_1^{i-1} | 0)}{W_N^{(i)}(y_1^N, \hat{u}_1^{i-1} | 1)} \quad (1)$$

where $y_1^N$ is a received signal vector (y1, y2, ..., and yN), $u_1^{i-1}$ is a bit vector (u1, u2, ..., and ui−1), W is a transition probability, and L represents a log-likelihood ratio.

If $i \subset A$, a decision is made as follows:

$$\hat{u}_i = \begin{cases} 0, & \text{if } L_N^{(i)}(y_1^N, \hat{u}_1^{i-1}) \geq 1 \\ 1, & \text{otherwise} \end{cases} \quad (2)$$

If $i \subset A^C$, simply let $\hat{u} = u_i$ (3).

In the foregoing formulas (2) and (3), $\hat{u}_i$ represents a decision value of a bit $u_i$.

An embodiment of the present invention provides the following Gaussian approximation algorithm to implement construction of punctured polar codes for different target code rates:

1. Initialization

Corresponding initialization is performed on a log-likelihood ratio of a symbol location of each polar code according to a target code rate and a rate matching solution, to obtain an initial mean value of the log-likelihood ratio of the symbol location of each polar code.

With reference to the description of the foregoing SC algorithm, a formula used for initialization includes:

$$E[L_1^{(i)}(y_i)] = \begin{cases} \frac{2}{\sigma^2} & \text{if } NoPuncturing\ x(i) \\ 0 & \text{if } puncturing\ x(i) \end{cases} \quad \text{(Formula 1)}$$

where puncturing represents puncturing, and NoPuncturing represents no puncturing, $x(i)$ represents a symbol location of the $i^{th}$ code, and $E[L_1^{(i)}(y_i)]$ represents an initial mean value of a log-likelihood ratio of the symbol location of the $i^{th}$ code.

2. Update

A mean value of the log-likelihood ratio of a node is calculated and updated according to a factor graph corresponding to the SC decoding.

Formulas used for calculation and update include:

$$\begin{cases} L_{n/2}^{(i)}(y_1^{n/2}, \hat{u}_{1,e}^{2i-2} \oplus \hat{u}_{1,\rho}^{2i-2}) = L_{n/2}^{(i)}(\text{up}) \\ L_{n/2}^{(i)}(y_{n/2+1}^n, \hat{u}_{1,e}^{2i-2}) = L_{n/2}^{(i)}(\text{down}) \end{cases} \quad \text{(Formula 2)}$$

$$\begin{cases} E[L_n^{(2i-1)}] = \begin{cases} \Phi^{-1}(1 - (1 - \Phi(E[L_{n/2}^{(i)}(\text{up})]))) \\ (1 - \Phi(E[L_{n/2}^{(i)}(\text{down})]))_{none\ of\ them\ equals\ 0} \\ 0 \quad E[L_{n/2}^{(i)}(\text{up})] = 0 \\ 0 \quad E[L_{n/2}^{(i)}(\text{down})] = 0 \end{cases} \\ E[L_n^{(2i)}] = E[L_{n/2}^{(i)}(\text{up})] + E[L_{n/2}^{(i)}(\text{down})] \end{cases} \quad \text{(Formula 3)}$$

Formula 2 defines $L_{n/2}^{(i)}(y_1^{n/2}, \hat{u}_{1,e}^{2i-2} \oplus \hat{u}_{1,\rho}^{2i-i})$ and $L_{n/2}^{(i)}(y_{n/2+1}^n, u_{1,e}^{2i-2})$.

Formula 3 involves $\varphi^{-1}(x)$, and $\varphi(x)$ may be represented as:

$$\varphi(x) = \begin{cases} 1 - \frac{1}{\sqrt{4\pi x}} \int_{-\infty}^{+\infty} \tanh\frac{u}{2} e^{-\frac{(u-x)^2}{4x}} du & x > 0 \\ 1 & x = 0 \end{cases}.$$

3. Error Probability Calculation

An error probability of the $i^{th}$ bit channel of the punctured polar code is obtained according to an updated mean value of the log-likelihood ratio.

A formula used for calculating the error probability includes:

$p_i = Q(\sqrt{E[L_N^{(i)}]/2})$, $1 \leq i \leq N$, where $p_i$ represents the error probability of the $i^{th}$ bit channel, and $Q(*)$ represents a Q function commonly used in communication.

The Q function is defined as $$Q(a) = \int_a^\infty \frac{1}{\sqrt{2\pi}} e^{-\frac{y^2}{2}} dy.$$

Figure 5:
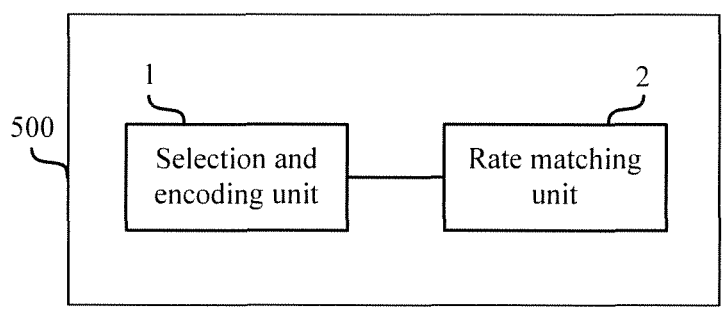
FIG. 5 is a structural block diagram of a hybrid automatic repeat request apparatus according to an embodiment of the present invention.

FIG. 5 is a structural block diagram of a hybrid automatic repeat request apparatus 500 according to an embodiment of the present invention, where the apparatus may include at least a selection and encoding unit 1 and a rate matching unit 2.

The selection and encoding unit 1 is configured to: select, from M polar codes of a same code length and code rate, a polar code corresponding to an actual code rate for a first transmission, and encode an information bit sequence by using the polar code to obtain encoded bits, where M is greater than or equal to 2.

For related content, refer to the previous descriptions in this specification, and details are not further described herein.

The rate matching unit 2 is configured to perform rate matching on the encoded bits to generate to-be-sent bits.

For related content, refer to the previous descriptions in this specification, and details are not further described herein.

Figure 6:
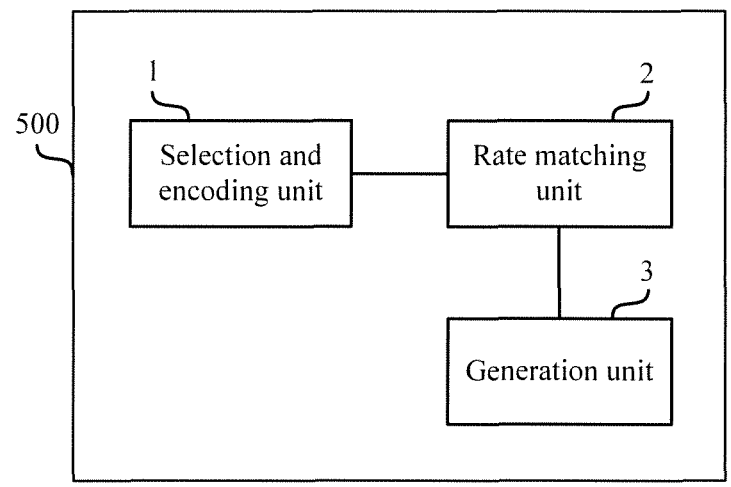
FIG. 6 is another structural block diagram of a hybrid automatic repeat request apparatus according to an embodiment of the present invention.

In another embodiment of the present invention, referring to FIG. 6, the hybrid automatic repeat request apparatus 500 may further include:

a generation unit 3, configured to generate the $i^{th}$ polar code in the M polar codes, where $1 \leq i \leq M$.

More specifically, in terms of generating the $i^{th}$ polar code, the generation unit is specifically configured to:

calculate an error probability of each bit channel for transmitting the $i^{th}$ polar code; and sort the error probabilities of all the bit channels, and select bit indexes corresponding to K bit channels with smallest error probabilities as an information bit set of the $i^{th}$ polar code, where K represents an information bit length.

For related content, refer to the previous descriptions in this specification, and details are not further described herein.

In another embodiment of the present invention, the M polar codes in all of the foregoing embodiments may be designed for different target code rates.

Correspondingly, in terms of selecting the corresponding polar code, the selection and encoding unit 1 may be specifically configured to:

select a polar code whose target code rate is closest to the actual code rate for the first transmission.

For related content, refer to the previous descriptions in this specification, and details are not further described herein.

Figure 7:
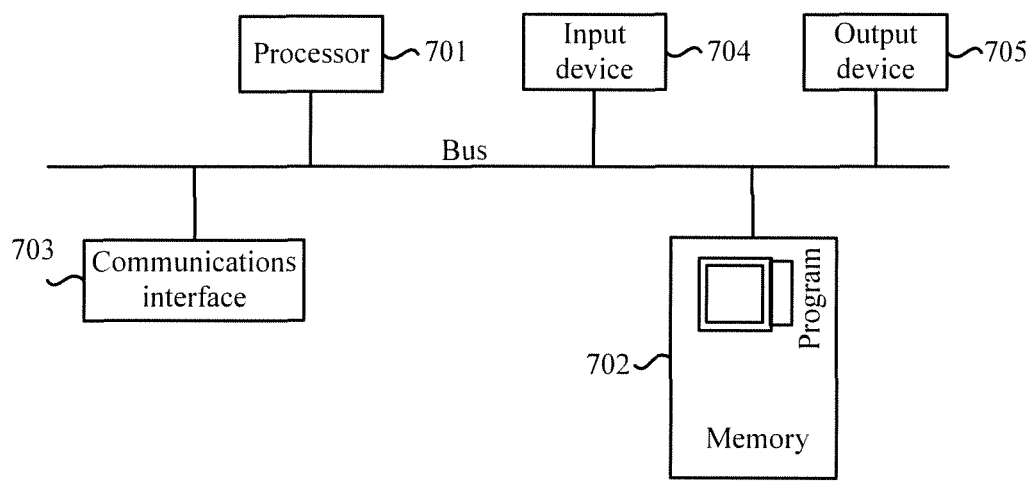
FIG. 7 is a structural diagram of a general-purpose computer system of a wireless communications apparatus according to an embodiment of the present invention.

A wireless communications apparatus is further claimed in an embodiment of the present invention. FIG. 7 illustrates a general-purpose computer system structure of the wireless communications apparatus 700.

The computer system may include a bus, a processor 701, a memory 702, a communications interface 703, an input device 704, and an output device 705. The processor 701, the memory 702, the communications interface 703, the input device 704, and the output device 705 are interconnected by using the bus.

The bus may include a path through which information is transmitted between components of the computer system.

The processor 701 may be a general-purpose processor, for example, a general-purpose central processing unit (CPU), a network processor (Network Processor, NP for short), a microprocessor, or the like; or may be an application-specific integrated circuit (application-specific integrated circuit, ASIC) or one or more integrated circuits for controlling execution of a solution program of the present invention; or may be a digital signal processor (DSP), an application-specific integrated circuit (ASIC), a field programmable gate array (FPGA) or another programmable logic device, a discrete gate or a transistor logic device, or a discrete hardware component.

The memory 702 stores a program executing a technical solution of the present invention, and may further store an operating system and other applications. Specifically, the program may include program code, and the program code includes computer operation instructions. More specifically, the memory 702 may be a read-only memory (read-only memory, ROM) or another type of static storage device for storing static information and instructions, a random access memory (random access memory, RAM) or another type of dynamic storage device for storing information and instructions, a disk memory, or the like.

The input device 704 may include an apparatus receiving data and information input by a user, such as a keyboard, a mouse, a camera, a scanner, a light pen, a voice input apparatus, or a touchscreen.

The output device 705 may include an apparatus allowing information to be output to a user, such as a screen, a printer, or a loudspeaker.

The communications interface 703 may be included in an apparatus using any transceiver, so as to communicate with another device or a communications network such as an Ethernet network, a radio access network (RAN), or a wireless local area network (Wireless Local Area Networks, WLAN).

The processor 701 executes the program stored in the memory 702 and is configured to implement the hybrid automatic repeat request method provided in the embodiments of the present invention. The method may include the following steps:

selecting, from M polar codes of a same code length and code rate, a polar code corresponding to an actual code rate for a first transmission, and encoding an information bit sequence by using the polar code to obtain encoded bits, where M is greater than or equal to 2; and performing rate matching on the encoded bits to generate to-be-sent bits.

For specific details, refer to the previous descriptions in this specification, and the details are not further described herein.

In addition, the foregoing apparatus may also perform the other steps involved in the hybrid automatic repeat request method and the specific descriptions of the steps that are described in this specification. Details are not further described herein.

Figure 8:
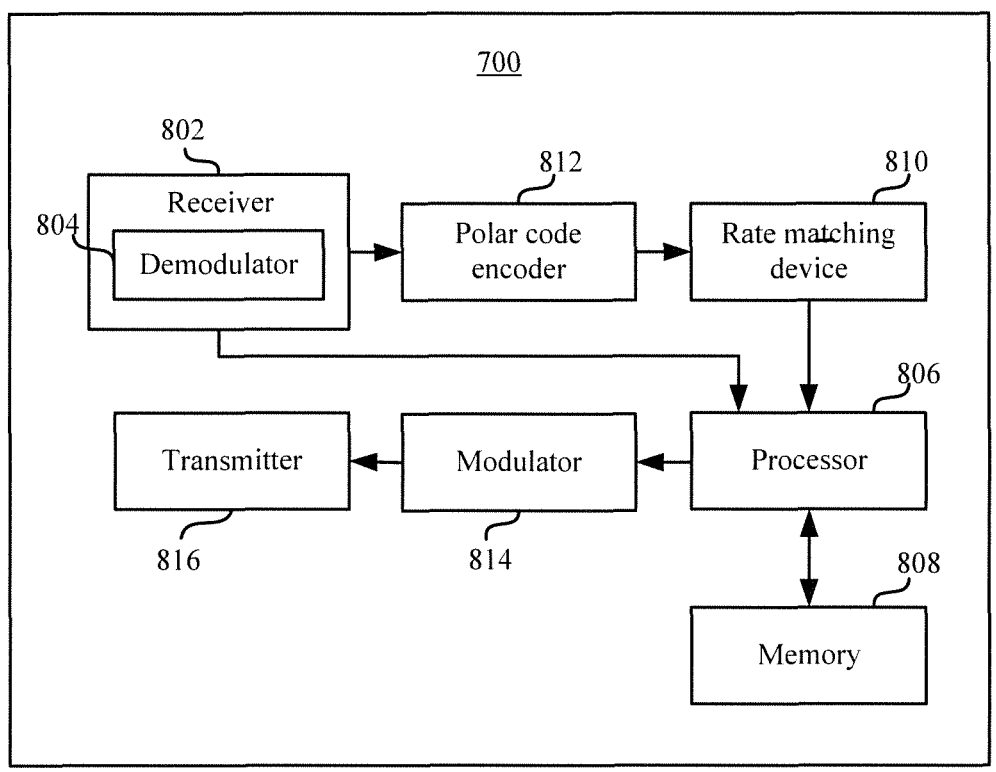
FIG. 8 is another schematic structural diagram of a wireless communications apparatus according to an embodiment of the present invention.

FIG. 8 is another schematic structural diagram of the wireless communications apparatus 700. The wireless communications apparatus 700 may include a receiver 802. The receiver 802 is configured to receive a signal from, for example, a receive antenna (not shown in the figure), perform typical actions (such as filtering, amplification, and down-conversion) on the received signal, and digitalize a modulated signal to obtain sampling. The receiver 802 may be, for example, an MMSE (minimum mean-squared error, Minimum Mean-Squared Error) receiver. A hybrid automatic repeat request apparatus 800 may further include a demodulator 804. The demodulator 804 is configured to demodulate the received signal and provide a demodulated signal to a processor 806. The processor 806 may be a processor dedicated to analyzing information received by the receiver 802 and/or generating information sent by a transmitter 816, a processor configured to control one or more components of the hybrid automatic repeat request apparatus 800, and/or a controller configured to analyze the signal received by the receiver 802, generate information sent by a transmitter 816 and control one or more components of the hybrid automatic repeat request apparatus 800.

The wireless communications apparatus 700 may additionally include a memory 808. The memory 808 is operably coupled to the processor 806 and stores the following data: to-be-sent data, received data, and any other proper information relevant to execution of various actions and functions described in this specification. The memory 808 may additionally store protocols and/or algorithms relevant to polar code processing.

It may be understood that the data storage apparatus (for example, the memory 808) described in this specification may be a volatile memory or non-volatile memory, or may include both a volatile memory and a non-volatile memory. In an example without limitation, the non-volatile memory may include a ROM (Read-Only Memory, read only memory), a PROM (Programmable ROM, programmable read only memory), an EPROM (Erasable PROM, erasable programmable read-only memory), an EEPROM (Electrically EPROM, electrically erasable programmable read-only memory), or a flash memory; and the volatile memory may include a RAM (Random Access Memory, random access memory), and is used for external high-speed cache. In exemplary rather than limited descriptions, RAMs in many forms may be used, for example, an SRAM (Static RAM, static random access memory), a DRAM (Dynamic RAM, dynamic random access memory), an SDRAM (Synchronous DRAM, synchronous dynamic random access memory), a DDR SDRAM (Double Data Rate SDRAM, double data rate synchronous dynamic random access memory), an ESDRAM (Enhanced SDRAM, enhanced synchronous dynamic random access memory), an SLDRAM (Synchlink DRAM, synchronous link dynamic random access memory), and a DR RAM (Direct Rambus RAM, direct rambus random access memory). The memory 808 in the system and method described in this specification aims to include but not limited to these memories and any other proper types of memories.

In addition, the wireless communications apparatus 700 may further include:

a polar code encoder 812, configured to: select, from M polar codes of a same code length and code rate, a polar code corresponding to an actual code rate for a first transmission, and encode an information bit sequence by using the polar code to obtain encoded bits, where M is greater than or equal to 2; and a rate matching device 810, configured to perform rate matching on the encoded bits to generate to-be-sent bits.

In a practical application, the receiver 802 may be further coupled to the rate matching device 810.

Optionally, in an embodiment, the polar code encoder 812 may be further configured to generate the M polar codes.

Alternatively, the M polar codes may be generated by another apparatus or a newly added apparatus.

Information bit index sets of the M polar codes are different but similar.

Similarity between the polar codes may be represented by the following formulas:

$$\begin{cases} A_i \\ A_1 = (A_i - \xi A_1) \cup \delta A_1 \\ A_2 = (A_i \xi A_2) \cup \delta A_2 \\ \ldots \\ A_{M-1} = (A_i - \xi A_{m-1}) \cup \delta A_{M-2} \end{cases}$$

In the foregoing formulas, $A_i$ represents an information bit index set of the $i^{th}$ polar code, and $A_1:A_{M-1}$ represents respective information bit index sets of the other (M−1) polar codes.

$\xi A_1$ represents a set of elements removed (elements removed from $A_1$) for constructing $A_i$, $\xi A_1$ represents a set of elements added for constructing $A_1$, and so on. Details are not further described herein.

Alternatively, $A_1=(A_i-\xi A_1)\cup\delta A_1$, $A_2=(A_i-\xi A_2)\cup\delta A_2, \ldots$, and $A_{M-1}=(A_i-\xi A_{M-1})\cup\delta A_{M-2}$ may be represented as $A_m=(A_i-\xi A_m)\cup\xi A_m$, where $A_m$ represents an information bit index set of the $m^{th}$ polar code in the other (M−1) polar codes (1≤m≤M−1, m≠i), $\xi A_m$ represents a set of elements removed from $A_i$ for generating $A_m$, and $\xi A_m$ represents a set of elements added to $A_i$ for generating $A_m$.

In addition, the wireless communications apparatus 700 may further include a modulator 814 and the transmitter 816, where the transmitter 816 is configured to send a signal to, for example, a base station, another terminal, or the like. Although shown as being separated from the processor 806, the polar code encoder 812, the rate matching device 810, and/or the modulator 814 may be a part of the processor 806 or multiple processors (not shown in the figure). The receiver 802 and the transmitter 816 may also be integrated together in a practical application to form a transceiver.

The wireless communications apparatus 700 may send or receive data through a channel (for example, the wireless communications apparatus 700 may send and receive data simultaneously, or the wireless communications apparatus 700 may send and receive data at different time points, or a combination thereof). The wireless communications apparatus 700 may be, for example, a base station (for example, the base station 101 in FIG. 1), or an access terminal (for example, the access terminal 116 in FIG. 1, or the access terminal 122 in FIG. 1).

The embodiments in this specification are described in a progressive manner, for same or similar parts in the embodiments, reference may be made to these embodiments, and each embodiment focuses on a difference from other embodiments. The apparatus provided in the embodiments is described relatively simply because it corresponds to the method provided in the embodiments, and for related parts, reference may be made to the description of the method.

It should be further noted that in this specification, relational terms such as first and second are only used to distinguish one entity or operation from another, and do not necessarily require or imply that any actual relationship or sequence exists between these entities or operations. Moreover, the terms "include", "comprise", or their any other variant is intended to cover a non-exclusive inclusion, so that a process, a method, an article, or an apparatus that includes a list of elements not only includes those elements but also includes other elements which are not expressly listed, or further includes elements inherent to such process, method, article, or apparatus. An element preceded by "includes a . . . " does not, without more constraints, preclude the existence of additional identical elements in the process, method, article, or apparatus that includes the element.

Through the foregoing description of the embodiments, it may be clearly understood by a person skilled in the art that the present invention may be implemented by software plus necessary universal hardware, where the universal hardware includes a universal integrated circuit, a universal CPU, a universal memory, a universal device, and the like, and definitely may also be implemented by application-specific hardware, like an application-specific integrated circuit, an application-specific CPU, an application-specific memory, an application-specific device, and the like, but in many cases, the former one is preferred. Based on such understandings, the essence of the technical solutions of the present invention or the part that makes contributions to the prior art can be embodied in a software product. The computer software product may be stored in a readable storage medium such as a USB flash disk, a mobile hard disk, a read-only memory (ROM), a random access memory (RAM), a magnetic disk, or an optical disc, where the storage medium incorporates several instructions causing a computer device (such as a personal computer, a server, or a network device) to perform the method specified in each embodiment of the present invention.

The embodiments provided above are described to enable a person skilled in the art to implement or use the present invention. Various modifications to the embodiments are obvious to the person skilled in the art, and general principles defined in this specification may be implemented in other embodiments without departing from the spirit or scope of the present invention. Therefore, the present invention will not be limited to the embodiments described in this specification but extends to the widest scope that complies with the principles and novelty provided in this specification.

What is claimed is:

1. A polar code hybrid automatic repeat request (HARQ) method based on M polar codes of a same code length and code rate, wherein M is greater than or equal to 2, the method comprising:
   selecting, from the M polar codes, a polar code corresponding to an actual code rate for a first transmission, and encoding an information bit sequence by using the polar code to obtain encoded bits; and
   performing rate matching on the encoded bits to generate to-be-sent bits.

2. The method according to claim 1, wherein information bit index sets of the M polar codes are different but similar.

3. The method according to claim 2, wherein similarity of the information bit index sets of the M polar codes satisfies the following formula:

$A_m=(A_i-\xi A_m)\cup\xi A_m$, wherein $A_i$ represents an information bit index set of the $i^{th}$ polar code in the M polar codes, $A_m$ represents an information bit index set of the $m^{th}$ polar code in the other (M−1) polar codes, 1≤i≤M, 1≤m≤M−1, m≠i, $\xi A_m$ represents a set of elements removed from $A_i$ for generating $A_m$, and $\xi A_m$ represents a set of elements added to $A_i$ for generating $A_m$.

4. The method according to claim 1, wherein the $i^{th}$ polar code in the M polar codes is generated in the following manner:
   calculating an error probability of each bit channel for transmitting the $i^{th}$ polar code, wherein $1 \leq i \leq M$; and
   sorting the error probabilities of all the bit channels, and selecting bit indexes corresponding to K bit channels with smallest error probabilities as an information bit set of the $i^{th}$ polar code, wherein K represents an information bit length.

5. The method according to claim 1, wherein the M polar codes are designed for different target code rates.

6. The method according to claim 5, wherein selecting a polar code comprises:
   selecting a polar code whose target code rate is closest to the actual code rate for the first transmission.

7. The method according to claim 5, wherein the target code rate is a target code rate for the first transmission.

8. A polar code hybrid automatic repeat request (HARQ) apparatus, comprising:
   a polar code encoder, configured to:
      select, from M polar codes of a same code length and code rate, a polar code corresponding to an actual code rate for a first transmission, and
      encode an information bit sequence by using the polar code to obtain encoded bits, wherein M is greater than or equal to 2; and
   a rate matching device, configured to perform rate matching on the encoded bits to generate to-be-sent bits.

9. The apparatus according to claim 8, wherein information bit index sets of the M polar codes are different but similar.

10. The apparatus according to claim 9, wherein similarity of the information bit index sets of the M polar codes satisfies the following formula:

$$A_m = (A_i - \xi A_m) \cup \xi A_m, \text{ wherein}$$

$A_i$ represents an information bit index set of the $i^{th}$ polar code in the M polar codes, $A_m$ represents an information bit index set of the $m^{th}$ polar code in the other (M−1) polar codes, $1 \leq i \leq M$, $1 \leq m \leq M-1$, $m \neq i$, $\xi A_m$ represents a set of elements removed from $A_i$ for generating $A_m$, and $\xi A_m$ represents a set of elements added to $A_i$ for generating $A_m$.

11. The apparatus according to claim 8, wherein the polar code encoder is further configured to:
   generate the $i^{th}$ polar code in the M polar codes, wherein $1 \leq i \leq M$.

12. The apparatus according to claim 11, wherein the polar code encoder is further configured to:
   calculate an error probability of each bit channel for transmitting the $i^{th}$ polar code; and
   sort the error probabilities of all the bit channels, and select bit indexes corresponding to K bit channels with smallest error probabilities as an information bit set of the $i^{th}$ polar code, wherein K represents an information bit length.

13. The apparatus according to claim 8, wherein:
the M polar codes are designed for different target code rates; and
the polar encoder is configured to: select a polar code whose target code rate is closest to the actual code rate for the first transmission.

* * * * *